United States Patent
Liu

(10) Patent No.: US 9,094,851 B2
(45) Date of Patent: Jul. 28, 2015

(54) SYSTEM AND METHOD FOR REDUCING INTERFERENCE IN WIRELESS COMMUNICATION

(71) Applicant: Rueywen Liu, South Bend, IN (US)

(72) Inventor: Rueywen Liu, South Bend, IN (US)

(*) Notice: Subject to any disclaimer, the term of this patent is extended or adjusted under 35 U.S.C. 154(b) by 0 days.

(21) Appl. No.: 14/040,187

(22) Filed: Sep. 27, 2013

(65) Prior Publication Data

US 2014/0086355 A1     Mar. 27, 2014

Related U.S. Application Data

(60) Provisional application No. 61/706,249, filed on Sep. 27, 2012.

(51) Int. Cl.
*H04B 15/00*     (2006.01)
*H04W 24/02*     (2009.01)

(52) U.S. Cl.
CPC ..................................... *H04W 24/02* (2013.01)

(58) Field of Classification Search
USPC ........................................................ 375/285
See application file for complete search history.

(56) References Cited

U.S. PATENT DOCUMENTS

2004/0171352 A1* 9/2004 Maeda et al. ............... 455/67.13
2013/0308475 A1* 11/2013 Celebi et al. .................. 370/252

* cited by examiner

*Primary Examiner* — Tanmay Shah
(74) *Attorney, Agent, or Firm* — Miller, Matthias & Hull LLP

(57) ABSTRACT

A system and method for reducing interference in a wireless communication system may include sending by a transmitter to a receiver a signal sequence $s=(s_1, s_2, \ldots, s_L)$ of length L and information bit m, the signal sequence s having an interference signal sequence $j=(j_1, j_2, \ldots, j_L)$. The system and method may also include identifying by the receiver an optimal lag $\alpha°$ of the signal sequence s in relation to the interference signal sequence j, determining an estimate of the information bit m from the optimal lag $\alpha°$ by the transmitter and calculating the signal to interference plus noise ratio by the receiver.

17 Claims, 3 Drawing Sheets

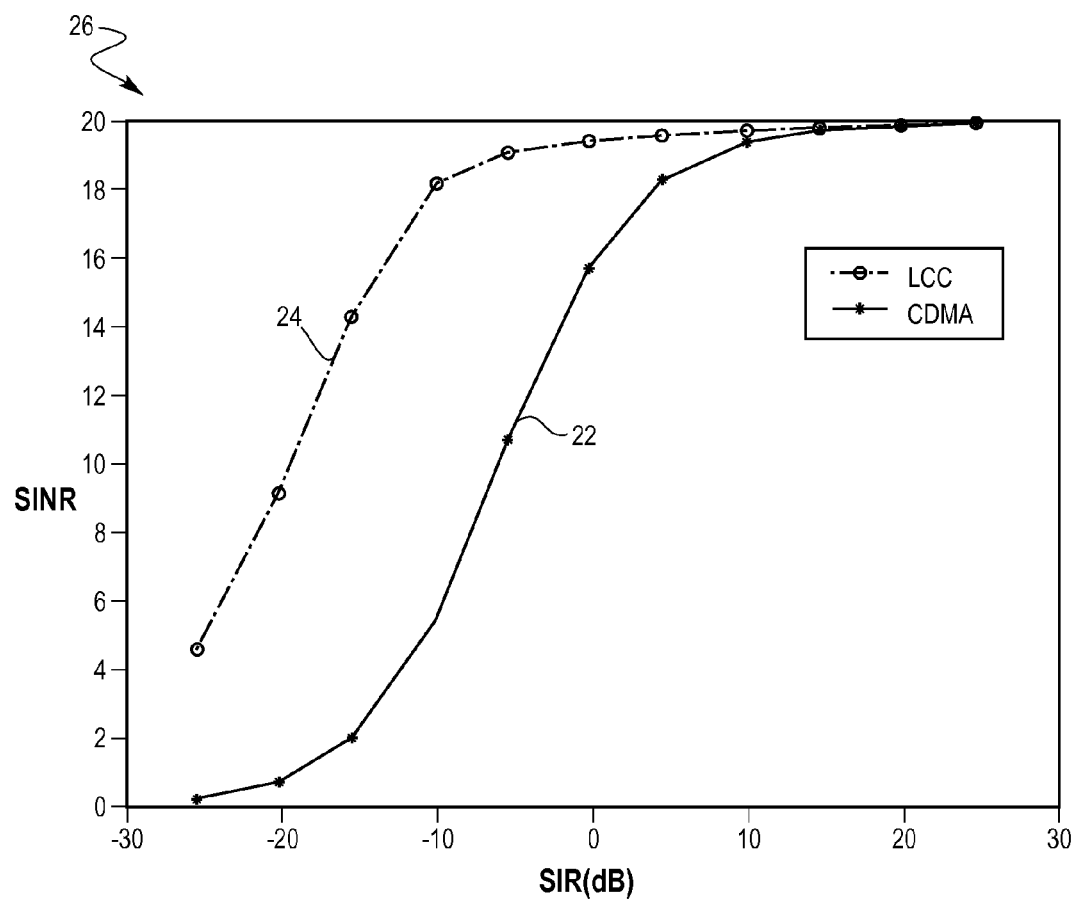

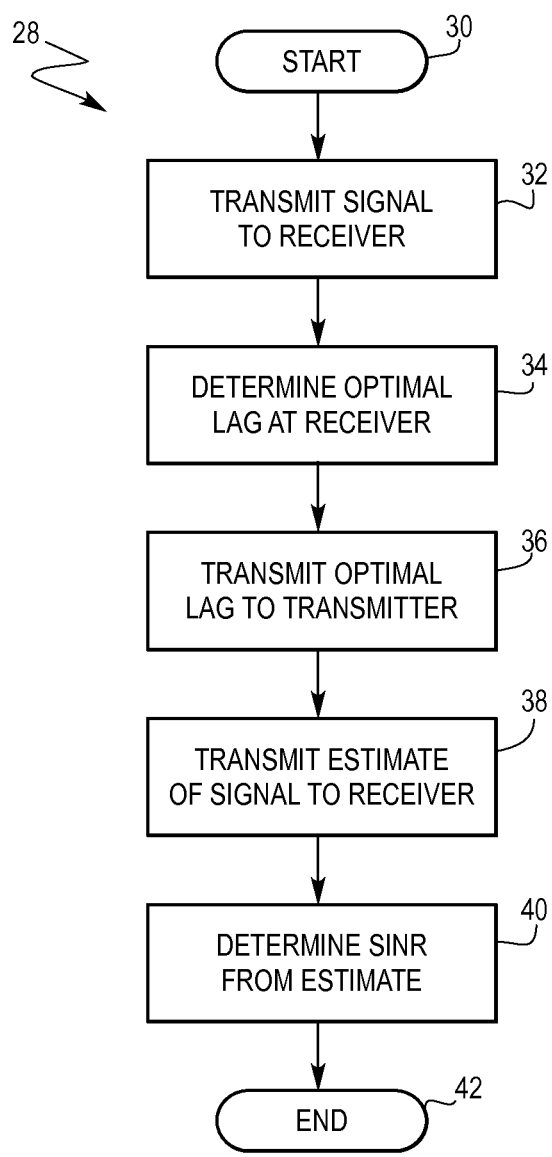

SYSTEM AND METHOD FOR REDUCING INTERFERENCE IN WIRELESS COMMUNICATION

CROSS-REFERENCE TO RELATED APPLICATIONS

This is a non-provisional U.S. patent application, which claims priority under 35 U.S.C. §119(e) to U.S. Provisional Patent Application Ser. No. 61/706,249 filed on Sep. 27, 2012, the entirety of which is incorporated by reference herein.

TECHNICAL FIELD OF THE DISCLOSURE

The present disclosure relates generally to wireless communications and, more particularly, relates to a system and method for reducing interference in wireless communications by achieving an optimal signal to interference plus noise ratio.

BACKGROUND OF THE DISCLOSURE

Wireless communication systems have become a major way of communication, replacing conventional land-based communication systems in many applications. There are many types of wireless communication systems, such as, cellular phone systems, wireless local area networks (LAN), Wi-Fi, ad-hoc networks and wireless sensor and control networks used in cyber-physical systems. While wirelessly communicating using a cellular phone system is well known, the other wireless communication systems are growing rapidly.

One common problem frequently encountered in wireless interactions between a receiver and a transmitter is the presence of interfering signals or interference originating from devices other than the transmitter and the receiver. Depending on the type of the wireless communication, in some applications, this interference may be intentional, such as the jamming of military wireless transmissions. In other applications, the interference may be accidental, for example, resulting from multiple users sharing a common wireless channel with or without a base station. The presence of such interfering signals can severely compromise the ability of the receiver to discern the signal from the intended sender, resulting in a reduction, sometimes significant reduction, of information throughput of the wireless transmission from the transmitter to the receiver.

To overcome the problem associated with interfering signals, several techniques, depending upon the type of the wireless communication system, are commonly employed. For example, in a Frequency Division Multiple Access technology (FDMA) multi-user cellular phone system, users are assigned non-overlapping frequency slots by the base station in order to avoid inter-user interference. Similarly in a Time Division Multiple Access technology (TDMA), users are assigned non-overlapping time-slots, while in a Code Division Multiple Access technology (CDMA), users are assigned non-overlapping orthogonal codes. Because of the limitation of the base stations, users that are outside a particular geographical area of the base station may not be controlled by the base station, and hence those users may interfere with the users within that geographical area.

Specifically, data may arrive at the receiver in a sequence of data-blocks. When the data is independent and identically distributed (i.i.d.) (e.g., in cellular phone systems operated in a licensed spectrum), the statistics of each data-block may be the same, although their realizations may be different. The statistics of each data-block may be estimated from past data-blocks and the statistics of future data-blocks may be predicted by the past and present data-blocks. Various i.i.d.-based signal processing techniques, such as, minimum mean square estimations (MMSE) and multi-user detection (MUD) may utilize the statistics described above to effectively control interference signals in i.i.d.-based wireless communication systems.

On the other hand, when the interferences are non-i.i.d., interference signals are typically not well controlled. This is generally due to the fact that the statistics of data-blocks may abruptly change from one data-block to another, and are not related to each other. Interferences in such networks may be significant because part of the spectrum utilized by those networks is unregulated or unlicensed. Examples of non-i.i.d. based systems may include wireless LAN, Wi-Fi and ad-hoc networks. When the wireless communication system is working under an unlicensed spectrum, the interference signals are not necessarily i.i.d. and, therefore, the conventional i.i.d.-based techniques (such MMSE and MUD used in cellular phone systems) are not so effective. These non-i.i.d. techniques are especially not effective when the interference is large. By virtue of utilizing the conventional techniques for overcoming interference, the current technology confines the wireless communications in wireless LAN, Wi-Fi and ad-hoc networks to be in the local area with limited number of users.

Moreover, the total effect of interference signals in cyber-physical systems can also be non-i.i.d. whether they are operated in a licensed spectrum or an unlicensed spectrum. This is because these interferences arrive randomly and hence cannot be synchronized in time. When these signals arrive randomly and cannot be synchronized in time, the total effect of these interferences is non-i.i.d. and cannot be effectively controlled utilizing conventional techniques.

Accordingly, there exists a need for a technique that may be utilized for effectively countering the negative effects of interfering signals particularly, in an unlicensed spectrum where the interferences are non-i.i.d.

SUMMARY OF THE DISCLOSURE

In accordance with at least some aspects of the present disclosure, a method for reducing interference in a wireless communication system is disclosed. The method may include providing a receiver in communication with a transmitter and sending by the transmitter to the receiver a signal sequence $s=(s_1, s_2, \ldots, s_L)$ of length L and information bit m, the signal sequence s having an interference signal sequence $j=(j_1, j_2, \ldots, j_L)$. The method may also include identifying by the receiver an optimal lag $\alpha°$ of the signal sequence s in relation to the interference signal sequence j, determining an estimate of the information bit m from the optimal lag $\alpha°$ by the transmitter and calculating a signal to interference plus noise ratio by the receiver.

In accordance with at least some other aspects of the present disclosure, a wireless communication system is disclosed. The wireless communication system may include a transmitter configured to transmit a signal sequence $s=(s_1, s_2, \ldots, s_L)$ of length L and information bit m, the signal sequence having an interference signal sequence $j=(j_1, j_2, \ldots, j_L)$ that is non-independent and identically distributed. The wireless communication system may also include a receiver configured to communicate with the transmitter and further configured to calculate an optimal signal to interference plus noise ratio to minimize the interference signal sequence j from an optimal lag $\alpha°$ of the signal sequence s.

In accordance with yet other aspects of the present disclosure, a least cross correlated wireless receiver is disclosed. The receiver may include a processing system configured to receive a signal sequence s=(s$_1$, s$_2$, ..., s$_L$) of length L and information bit m from a transmitter, the signal sequence s having an interference signal sequence j=(j$_1$, j$_2$, ..., j$_L$). The processing system may be further configured to determine an optimal lag α° of the signal sequence s by rotating the signal sequence s clockwise α times and find a minimum correlation from the rotated signal sequence, transmit the optimal lag α° to the transmitter, receive an estimate ms$^{(\alpha°)}$ of the information bit m based on the optimal lag α° from the transmitter and calculate a signal to interference plus noise ratio from the estimate ms$^{(\alpha°)}$.

These and other aspects and features of the present disclosure will be more readily understood upon reading the following description when taken in conjunction with the accompanying drawings.

BRIEF DESCRIPTION OF THE DRAWINGS

FIG. 2 is a graphical representation showing performance of a least cross correlated (LCC) receiver, in accordance with at least some embodiments of the present disclosure, and comparing the LCC receiver with a conventional CDMA receiver; and FIG. 3 is an exemplary flowchart outlining steps for achieving an optimal signal to optimal noise ratio (SINR) in the LCC receiver of FIG. 2.

Figure 1:
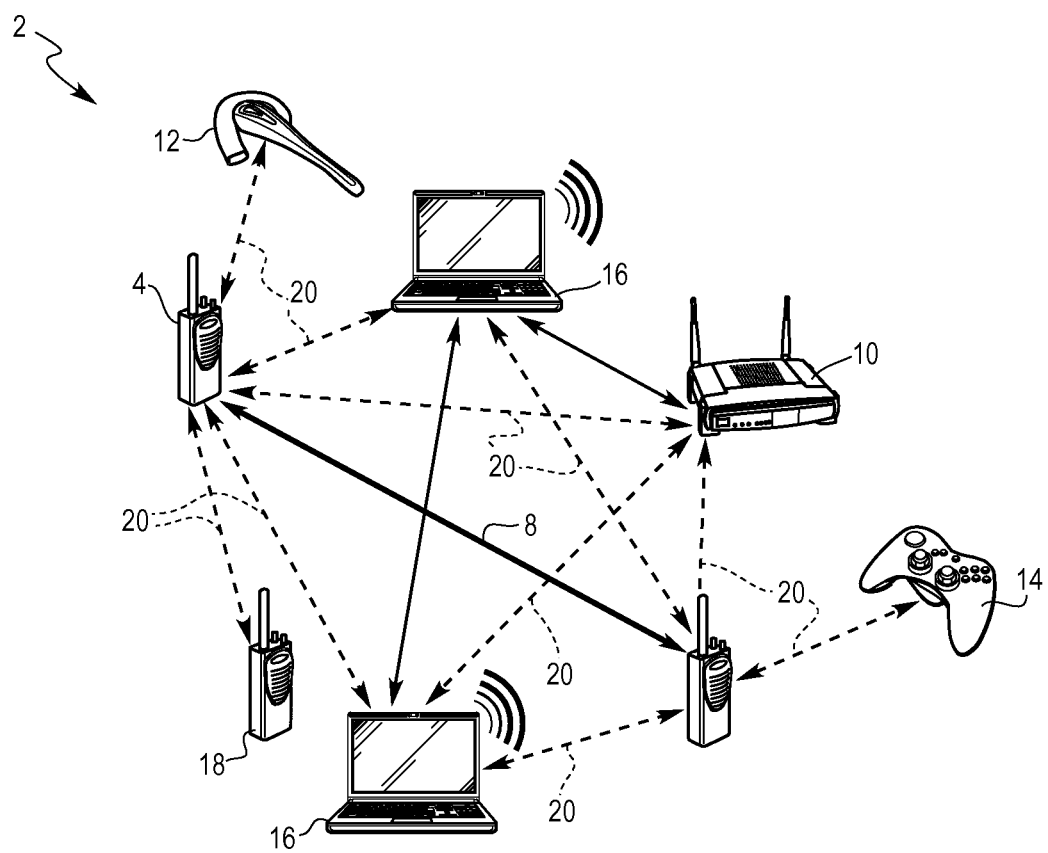
FIG. 1 is a schematic diagram illustrating various types of wireless communication systems in which the present disclosure may be implemented to effectively block interference signals during wireless communications between a receiver and a transmitter.

While the present disclosure is susceptible to various modifications and alternative constructions, certain illustrative embodiments thereof, will be shown and described below in detail. It should be understood, however, that there is no intention to be limited to the specific embodiments disclosed, but on the contrary, the intention is to cover all modifications, alternative constructions, and equivalents along within the spirit and scope of the present disclosure.

DETAILED DESCRIPTION OF THE DISCLOSURE

Referring now to FIG. 1, an exemplary wireless communication system 2 illustrating various types of wireless communication devices is shown, in accordance with at least some embodiments of the present disclosure. In at least some embodiments, the wireless communication system 2 may be a multi-user wireless communication system having several groups of users, with each user communicating with other users within its own group. Users of other groups may cause interference to the communicating users of a group. For example and as shown, the wireless communication system 2 may include a receiver 4 in communication with a transmitter 6 via a wireless channel 8. The wireless communication system 2 may also include several other wireless devices such as, a Wi-Fi router 10, a Bluetooth earphone 12, a wireless game controller 14, computers 16 having Wi-Fi and/or Bluetooth capabilities and an intercom device 18. These wireless devices may cause interference to the receiver 4 and the transmitter 6 by creating interference signals 20 when the receiver and the transmitter communicate with each other.

Notwithstanding the fact that in the present embodiment, only certain types of wireless devices have been shown, this is merely exemplary. In other embodiments, other types of wireless devices capable of creating interference signals are contemplated and considered within the scope of the present disclosure. Furthermore, the number of those wireless devices may vary as well. Additionally, it will be understood that only those components that are necessary for a proper understanding of the disclosure are shown and described herein. Nevertheless, several other components that are commonly employed in wireless communications, such as various filters, are also contemplated and considered within the scope of this disclosure.

With respect to the receiver 4, it may be a least cross correlated (LCC) receiver configured to minimize the interference signals 20 during communication with the transmitter 6. Although not shown, the receiver 4 may include a controller having a processing system configured to access any of a variety of volatile or non-volatile memory/storage devices, such as, flash memory, memory cards, read only memory (ROM), programmable read only memory (PROM), erasable programmable read only memory (EPROM), electronically erasable programmable read only memory (EEPROM), etc. The controller and particularly, the processing system of the controller may also be configured to run one or more software programs or applications stored in a memory location, read from a computer readable medium, and/or accessed from an external device operatively coupled to the controller by any suitable communication network. The transmitter 6 may be similarly configured as the receiver 4. Other devices, components and/or systems that are commonly employed in combination or conjunction with receivers and transmitters involved in wireless communication are contemplated and considered within the scope of the present disclosure.

Referring still to FIG. 1, an exemplary communication between the transmitter 6 and the receiver 4 may involve transmitting a signal sequence s=(s$_1$, s$_2$, ..., s$_L$) with length L by the transmitter and targeted for the receiver. An information bit m may be attached to the signal sequence s by ms. When the signal sequence s is transmitted from the transmitter 6 to the receiver 4, the signal sequence may be corrupted by an interference signal sequence j=(j$_1$, j$_2$, ..., j$_L$) that may be generated, for example, by one or more of the other wireless devices (such as the Wi-Fi router 10, the Bluetooth earphone 12, the wireless game controller 14, the computers 16 and/or the intercom device 18) present within the wireless communication system 2.

At a time k, the signal sequence s corrupted by the interference signal sequence j that is received at the receiver 4 may be given by:

$$x(k)=mh(z^{-1})s(k)+j(k)+n(k) \quad (1)$$

where x=(x$_1$, x$_2$, ..., x$_L$) may be the received sequence and n=(n$_1$, n$_2$, ..., n$_L$) may be the noise sequence that is i.i.d. The channel 8 may be modeled by a scalar polynomial h(z$^{-1}$) of a delay operator z$^{-1}$ and when there is no multipath, the channel may become a scalar h. When time variance of the channel 8 is slow compared with the time duration for each computation, the channel may be modeled as a constant. Furthermore, the interference signal sequence j may have two components, $$j=j_{ma}+j_{cc} \quad (2)$$

where j$_{ma}$ may be the multiple access interference, which is the interferences due to in-house users, and j$_{cc}$ be the co-channel interference, which includes all other interferences, and is usually non-i.i.d. The co-channel interference may include intentional jamming signals such as those used in military applications.

Upon normalizing the signals to unit power and for simplicity but without loss of generality assuming that there is no multipath and with $h(z^{-1})=1$, the received sequence at the receiver 4 may be correlated by the signal sequence s as:

$$<x(k),s(k)>=m+<j(k),s(k)>+<n(k),s(k)> \quad (3)$$

The three terms above may be related to signal power, interference power and noise power respectively, at the output of the receiver 4. From equation (3), the signal to interference plus noise ratio (SINR) may be calculated by:

$$SINR = \frac{m^2}{|<j(k),s(k)>|^2 + |<n(k),s(k)>|^2} \quad (4)$$

For a conventional CDMA receiver, since the signal sequences within the same group are orthogonal to each other, the interference signal sequence j may be modeled as:

$$<j,s>=<j_{ma},s>+<j_{cc},s>=<j_{cc},s> \quad (5)$$

The first term in the interference signal sequence may become zero because in-house user signals in a CDMA system are orthogonal. Hence, the SINR may be improved by the orthogonality of the user signals. Furthermore, if the co-channel interference is a narrow band signal and s is a broad band signal, then the power of the co-channel interference may be reduced by a factor that is related to L, the length of s. Thus, by correlating the received signal at the conventional CDMA receiver by the desired signal sequence, the SINR at the output may be improved by a factor that is related to L. This is commonly termed as the spread spectrum technique.

The SINR for a conventional CDMA receiver is shown in FIG. 3 by CDMA plot 22. SINR is typically used as a performance index for controlling interference. Since SINR may be a determinant factor to information throughput for a given frequency spectrum and may also be a design reference for a receiver, the receiver may perform better when SINR is above some reference number (e.g., ten). As will be discussed further below, in contrast to the conventional CDMA receiver, the receiver 4 (e.g., the LCC receiver) may provide a better response to interference signal sequences as a result of having a higher SINR. Specifically, the signal sequence s in the LCC receiver may be modified as follows:

Given the desired signal sequence $s=(s_1, s_2, \ldots, s_L)$, a rotation operation $\alpha$ may be defined by $$s^{(\alpha)}=(s_{L-\alpha+1},\ldots,s_L,s_1,s_2,\ldots,s_{L-\alpha}) \quad (6)$$

In other words, $s^{(\alpha)}$ may be obtained by rotating the signal sequence s clockwise among its elements $\alpha$-times. By now transmitting $ms^{(\alpha)}$, the received signal at the receiver 4 may be given by:

$$x^{(\alpha)}(k)=ms^{(\alpha)}(k)+j(k)+n(k) \quad (7)$$

Correlating equation (7) by $s^{(\alpha)}$ at the receiver 4:

$$<x^{(\alpha)}(k),s^{(\alpha)}(k)>=m+<j(k),s^{(\alpha)}(k)>+<n(k),s^{(\alpha)}(k)> \quad (8)$$

Hence, the SINR when $ms^{(\alpha)}$ is transmitted may be given by $$SINR^{(\alpha)} = \frac{m^2}{|<j(k), s^{(\alpha)}(k)>|^2 + |<n(k), s^{(\alpha)}(k)>|^2} \quad (9)$$

To maximize $SINR^{(\alpha)}$ with respect to $\alpha$, $|<j(k),s^{(\alpha)}(k)>|$ may need to be minimized because the term $|<n(k), s^{(\alpha)}(k)>|$ is invariant with $\alpha$ or in other words, a best rotation for $\alpha$ may be found by:

$$\alpha^o = \left\{ \min_\alpha |<j, s^{(\alpha)}>| \right\} \quad (10)$$

The meaning of (10) may be explained as follows. Let $\bar{s}$ be the extension of s, i.e., $\bar{s}$ may be an infinite periodic sequence with period L, with each period being s. Similarly $\bar{j}$ may be defined. Then, Eq. (10) may be equivalent to $$\alpha^o = \left\{ \min_\alpha |Ex\{\bar{j}*(k)\bar{s}(k-\alpha)\}| \right\} \quad (11)$$

In other words, $\alpha^o$ may be the least cross-correlation between $\bar{s}$ and $\bar{j}$. Therefore, equation (10) may be called the least cross correlation (LCC) Criterion on which the receiver 4 may be based.

Once the optimal lag $\alpha^o$ is found, $ms^{(\alpha^o)}$ may be transmitted and correlated with the received signal by $s^{(\alpha^o)}$:

$$<x^{(\alpha^o)},s^{(\alpha^o)}>=m+<j,s^{(\alpha^o)}>+<n,s^{(\alpha^o)}> \quad (12)$$

Then equation (12) may become an estimate of m and its SINR may be given by $$SINR^{(\alpha^o)} = \frac{m^2}{|<j, s^{(\alpha^o)}>|^2 + |<n, s^{(\alpha^o)}>|^2} \quad (13)$$

The above equation may provide the SINR at the output of the receiver 4, which is shown by SINR plot 24 in FIG. 2.

Turning now to FIG. 2, an exemplary graphical representation 26 plotting a Signal-to Interference-plus-Noise ratio (SINR) on the Y-axis at the output of the receiver 4 against a Signal-to-Interference ratio (SIR) or the power of interference on the X-axis at the input of the receiver is shown, in accordance with at least some embodiments of the present disclosure. Specifically, the graphical representation 26 includes the CDMA plot 22, which shows the performance of a conventional CDMA receiver, and the SINR plot 24, which shows the performance of a least cross correlation (LLC) receiver such as the receiver 4. The SIR is non-i.i.d.

For purposes of explanation, the signal to noise ratio (SNR) is set at thirteen decibels (13 db). In other words, the signal power is twenty times the noise power. Also, it is assumed that the receiver 4 may perform better when the SINR is above ten (10). It may be seen from FIG. 2 that the CDMA receiver performs well (e.g., the SINR is greater than or equal to ten) for SIR bigger than a negative five decibels (−5 db), while performs poorly (e.g., the SINR is less than ten) when the SIR is less than negative five decibels (−5 db).

In contrast, the LCC receiver, that is, the receiver 4 performs uniformly better than that of the CDMA receiver. Furthermore, it may be seen that the LCC receiver performs better when the interference power is stronger. For example, when using a value of SINR as ten (10) for reference, it may be seen that while the CDMA receiver is cut-off (e.g., the SINR falls below ten) when the SIR is smaller than a negative five decibels (−5 dB), the LCC receiver continues to perform well at that SIR, achieving an SINR of much greater than ten (10). In fact, the LCC receiver may not be cut-off until the SIR falls below than a negative twenty decibels (−20 dB). Thus, the LCC receiver may perform at least fifteen decibels (15 dB) better than the CDMA receiver. In other words, the LCC receiver may be capable of handling greater powers of interference (e.g., greater than 20 times) compared to the conventional CDMA receiver.

Thus, the LCC receiver performs better when the interferences are strong and when the interferences are non-i.i.d. In communication systems operating in an unlicensed spectrum, such as Wireless LAN, Wi-Fi, ad-hoc networks, and recently the cyber-physical systems, strong non-i.i.d. interferences have been a limiting factor and such systems may perform better in strong interference conditions with an LCC receiver.

In fact, the inventor has found that the LCC receiver performs better than multiple antenna receivers. For example, a two-antenna receiver may have the potential to improve interference performance compared to a single antenna receiver by two. Thus, when SIR is equal to a negative fifteen decibels (−15 dB), the SINR for a single antenna CDMA receiver is about two (2) and a two-antenna CDMA receiver may improve the SINR to about four (4) at most. Given that the SINR in both the above cases is below ten (10), those receivers may be cut-off. However, even at the negative fifteen decibels (−15 dB), the LCC receiver achieves an SINR value of twelve (12) and, therefore, performs better than even the two-antenna CDMA receiver.

Referring now to FIG. 3, an exemplary flowchart 28 outlining the steps of obtaining the SINR for the LCC receiver is shown, in accordance with at least some embodiments of the present disclosure. After starting at a step 30, the determination of SINR may begin when the transmitter 6 transmits a signal sequence s and information bit m to the receiver 4 at a step 32. Upon receiving the signal sequence and information bit, the receiver 4 in order to reduce interference may implement an LCC criterion. Specifically, the LCC criterion may involve identifying an optimal lag of $\alpha°$ by the receiver 4 at a step 34. The optimal lag of $\alpha°$ may be determined by first transmitting a zero signal s=0. Then, the received signal may be correlated to $s^{(\alpha)}$ for $\alpha=0, 1, \ldots, L-1$. After that, the optimal lag $\alpha°$ may be identified by finding the minimum among the correlations obtained above. It will be understood that the zero-signal above may be replaced by other signals. For example, the desired code signal may be i.i.d. used in CDMA in which case, the autocorrelation may be zero everywhere except when the lag is zero. As such, we may skip the optimal rotation if it happened to be at zero-lag and the worst outcome may lead to the second best estimation.

Upon determining the optimal lag, the optimal lag $\alpha°$ may be transmitted back to the transmitter 6 at a step 36. The information bit m may be transmitted again by the transmitter 6 by transmitting $ms^{(\alpha°)}$, and the estimate m may be obtained by correlating the received signal by $s^{(\alpha°)}$ as shown in equation (12) above at a step 38. Then, at a step 40, the SINR may be calculated by equation (13) above at the output of the receiver 4. The process ends at a step 42.

INDUSTRIAL APPLICABILITY

The present invention sets forth a least cross correlation (LCC) receiver that is capable of overcoming greater interferences, especially when the interferences are non-i.i.d. Under this condition, a feedback system is presented that can achieve a signal to interference-plus-noise ratio (SINR) at the output of the receiver that is much higher (by at least twenty times) than a conventional CDMA receiver. The LCC receiver provides a substantially optimal solution in (non-zero) lags of the cross-correlation between the interference and the desired signal sequence. Being optimal (or substantially optimal) in SINR implies optimal (or substantially optimal) information throughput, channel capacity and/or coverage range.

While only certain embodiments have been set forth, alternatives and modifications will be apparent from the above description to those skilled in the art. These and other alternatives are considered equivalents and within the spirit and scope of this disclosure and the appended claims.

What is claimed is:

1. A method for reducing interference in a wireless communication system, the method comprising:
   providing a receiver communicating in an unlicensed spectrum with a transmitter;
   sending by the transmitter to the receiver a signal sequence $s=(s_1, s_2, \ldots, s_L)$ of length L and information bit m, the signal sequence s having an interference signal sequence $j=(j_1, j_2, \ldots, j_L)$;
   identifying by the receiver an optimal lag $\alpha°$ of the signal sequence s in relation to the interference signal sequence j;
   determining an estimate of the information bit m from the optimal lag $\alpha°$ by the transmitter; and
   calculating a signal to interference plus noise ratio by the receiver.

2. The method of claim 1, wherein identifying the optimal lag $\alpha°$ comprises:
   transmitting a zero signal s=0; and
   correlating the zero signal to $s^{(\alpha)}$ for $\alpha=0, 1, \ldots, L-1$.

3. The method of claim 2, wherein correlating the zero signal comprises rotating the signal sequence s clockwise $\alpha$ times.

4. The method of claim 3, further comprising finding a minimum correlation in the correlated zero signal.

5. The method of claim 1, wherein determining the estimate comprises:
   feeding the optimal lag $\alpha°$ back to the transmitter; and
   transmitting the information bit m by sending $ms^{(\alpha°)}$ to the receiver.

6. The method of claim 1, wherein calculating the signal to interference plus noise ratio comprises correlating the estimate at the receiver by $s^{(\alpha°)}$.

7. The method of claim 1, wherein the receiver is a least cross correlated receiver.

8. The method of claim 7, wherein the interference handling capability of the least cross correlated receiver is at least twenty times greater than that of a code division multiple access receiver.

9. The method of claim 7, wherein a signal to interference ratio of the least cross correlated receiver is at least fifteen decibels higher than that of a code division multiple access receiver.

10. The method of claim 1, wherein the interference signal sequence is non-independent and identically distributed.

11. A wireless communication system to reduce interference, the system comprising:
   a transmitter configured to transmit a signal sequence $s=(s_1, s_2, \ldots, s_L)$ of length L and information bit m, the signal sequence having an interference signal sequence $j=(j_1, j_2, \ldots, j_L)$ that is non-independent and identically distributed; and
   a receiver configured to communicate wirelessly in an unlicensed spectrum with the transmitter, the receiver further configured to calculate an optimal signal to interference plus noise ratio to minimize the interference signal sequence j from an optimal lag $\alpha°$ of the signal sequence s.

12. The wireless communication system of claim 11, wherein the receiver is a least cross correlated receiver.

13. The wireless communication system of claim 11, wherein the transmitter determines an estimate of the information bit m from the optimal lag $\alpha°$ to calculate the optimal signal to interference plus noise ratio.

14. The wireless communication system of claim 11, wherein the interference handling capability of the receiver is at least twenty times greater than that of a code division multiple access receiver.

15. A least cross correlated wireless receiver, comprising:
a processing system configured to receive a signal sequence $s=(s_1, s_2, \ldots, s_L)$ of length L and information bit m from a transmitter, the signal sequence s having an interference signal sequence $j=(j_1, j_2, \ldots, j_L)$, the processing system further configured to (a) determine an optimal lag $\alpha°$ of the signal sequence s by rotating the signal sequence s clockwise $\alpha$ times and find a minimum correlation from the rotated signal sequence; (b) transmit the optimal lag $\alpha°$ to the transmitter; (c) receive an estimate $ms^{(\alpha°)}$ of the information bit m based on the optimal lag $\alpha°$ from the transmitter; and (d) calculate a signal to interference plus noise ratio from the estimate $ms^{(\alpha°)}$, wherein the least cross correlated wireless receiver and the transmitter communicate wirelessly in an unlicensed spectrum.

16. The least cross correlated wireless receiver of claim 15, wherein the interference signal sequence j is non-independent and identically distributed.

17. The least cross correlated wireless receiver of claim 15, wherein the least cross correlated wireless receiver's interference handling capability is at least twenty times greater than that of a code division multiple access receiver.

* * * * *